United States Patent [19]

Bodin et al.

[11] Patent Number: 4,490,228

[45] Date of Patent: Dec. 25, 1984

[54] METHOD OF MANUFACTURING A REFLECTING SURFACE

[75] Inventors: Claude Bodin, Bracieux; Alain Gouin, La Chapelle Vendomoise, both of France

[73] Assignee: Equipements Automobiles Marchal, Issy-Les-Moulineaux, France

[21] Appl. No.: 474,670

[22] PCT Filed: Jun. 24, 1982

[86] PCT No.: PCT/FR82/00105

§ 371 Date: Feb. 25, 1983

§ 102(e) Date: Feb. 25, 1983

[87] PCT Pub. No.: WO83/00208

PCT Pub. Date: Jan. 20, 1983

[30] Foreign Application Priority Data

Jun. 26, 1982 [FR] France .................... 81 12658

[51] Int. Cl.³ .............................................. C23C 15/00
[52] U.S. Cl. .................................. 204/192 R; 350/600; 427/123; 427/124; 427/125; 428/469
[58] Field of Search .................... 204/192 R; 350/288; 428/469; 427/123, 124, 125

[56] References Cited

U.S. PATENT DOCUMENTS

| | | | |
|---|---|---|---|
| 3,687,713 | 8/1972 | Adams | 350/288 |
| 4,009,947 | 3/1977 | Nishida et al. | 350/288 |
| 4,340,646 | 7/1982 | Ohno et al. | 428/469 |
| 4,341,841 | 7/1982 | Ohno et al. | 350/288 |
| 4,348,463 | 9/1982 | Ohno et al. | 428/469 |
| 4,358,507 | 11/1982 | Senaha et al. | 428/469 |
| 4,364,637 | 12/1982 | Ohno et al. | 350/288 |
| 4,393,120 | 7/1983 | Watal et al. | 427/125 |

*Primary Examiner*—Arthur P. Demers
*Attorney, Agent, or Firm*—Brisebois & Kruger

[57] ABSTRACT

A method of manufacturing a reflecting metal surface, in particular to obtain reflectors for the lighting projector for motor vehicles. In this method a resin layer is projected onto the raw metal surface; onto the said layer of hardened resin is projected a layer containing a metal taken from the group formed by nickel, nickel-chrome alloys, alloys of the above mentioned metal compounds with aluminium, and silicon; then, if the above named layer contains less than n% by weight of aluminium, a fine coating containing a metal taken from the group formed by aluminium and its alloys at more than n% by weight, n being a number at most equal to 100, the value of which corresponds to the minimum brightness state tolerable for the metal reflecting surface to be obtained, is projected onto the layer. The object of the invention is also the reflectors obtained by this method as well as the use of these reflectors for lighting projectors.

19 Claims, No Drawings

METHOD OF MANUFACTURING A REFLECTING SURFACE

The present invention relates to a method of manufacturing a reflecting metal surface which can especially be used in order to form a reflector, in particular for the headlight of a motor vehicle.

It is known that for certain metal parts for industrial use surfaces with a very great reflective power are sought; this is in particular the case for parts which reflect light or heat waves, for example reflectors intended for headlights for motor vehicles. In order to achieve this a coating of aluminium is applied by metallization under vacuum to the surface of the part previously treated. In a traditional method the metal surface which is to be aluminized is polished, then in several layers a sufficient thickness of varnish is applied to the polished surface with a view to obtaining a satisfactory surface state. This technique has the main disadvantage of being difficult, slow and troublesome. Thus there has already been proposed in the French Pat. No. 2 304 690 an improvement of this prior art in which firstly a layer of powdered resin is applied to the unpolished metal surface; in which secondly the resin layer is melted and hardened on its base; and in which thirdly a coating of bright aluminium is applied to the surface thus pretreated. If the resin is sufficiently polymerized on its base before the application of aluminium this technique is satisfactory for surfaces which do not undergo any subequent relatively great heating; but if there is subsequent great heating, either when using the part or during a subsequent finishing operation, it has been ascertained that the layer of bright aluminium tended to tarnish.

In the case of reflectors for car headlights it is evident that the reflector always undergoes a considerable increase in temperature during operation, in the vicinity of the lighting lamp. It was thus necessary in the case of reflectors for motor vehicles to remedy this risk of deterioration of the optical qualities of the reflective surface. In the above mentioned French Pat. No. 2 304 690 the application on the resin layer of a layer of phenolic or water-soluble varnish compatible with the resin layer has already been disclosed; this layer of varnish improves the adhesion of the aluminium coating on the resin and it has been noted that its presence eliminates any risk of the reflective surface tarnishing if the temperature rises subsequently. It is thought, although this explanation is in no way limiting, that tarnishing is due to the difference of the expansion coefficients existing between the resin and the layer of bright aluminium, and that the interposition of varnish avoids the disadvantages which could arise if the elastic limit of aluminium is exceeded owing to the great expansion of the resin which forms its base.

The use of such a varnish between the resin layer and the layer of bright aluminium is thus entirely satisfactory for the manufacture of reflectors of headlights of motor vehicles but it has several disadvantages: firstly, the varnish used is a relatively expensive product, secondly the application of the varnish forms an additional stage in the manufacture of headlights and thus increases manufacturing time and costs; thirdly, the varnish requires a drying force. It can thus be seen that, although the application of a varnish is satisfactory from a practical point of view, it entails disadvantages from a financial point of view.

The object of the present invention is to propose an improvement for this type of manufacture of reflecting metal surfaces. According to this improvement the application of a varnish between the resin layer and the bright metal film of the reflector is omitted but any risk of tarnishing in the case of a subsequent rise in temperature of the part after manufacture is avoided. Such a part may thus be used without difficulty in order to form a reflector for a headlight.

According to the invention it has been ascertained that if a layer composed, in a form combined or not with another element such as oxygen, of silicon, nickel or a nickel-chrome alloy, is applied directly on the resin layer there is no longer any risk of the reflecting surface applied to the resin layer tarnishing. If the layer applied directly on the resin layer comprises in addition to the nickel or a nickel-chrome alloy a sufficiently high percentage of aluminium it has sufficient reflecting characteristics to form by itself the desired reflecting metal film. On the other hand, if the layer applied directly to the resin layer only comprises a little or no aluminium it is advisable to apply to this metal layer a metal coating containing a high percentage of aluminium, and this metal coating can be pure aluminium or an alloy of aluminium. In other words, according to the invention either a single layer comprising a high percentage of aluminium and a low percentage of nickel or nickel-chrome alloy is applied to the resin layer or a layer with a low percentage of aluminium (or without aluminium) formed of silicon, nickel or a nickel-chrome alloy then a layer with a high percentage of aluminium (or formed of pure aluminium) is applied. In both cases this method is much more advantageous than that which consisted in applying an intermediate layer of varnish before the reflecting layer. In fact, in the first case mentioned above, only a single layer is applied to the resin layer; in the second case mentioned above a metal layer is applied and then covered by a metal coating but the layer and the coating can be carried out in the same transfer apparatus under vacuum which in fact dispenses with one manufacturing cycle and the corresponding costs.

The transfer under vacuum to apply the above mentioned layer, and possibly the coating which overlies it, may be metallization under vacuum of the conventional type: in this case it is carried out in a enclosure or housing under reduced pressure by placing the parts to be metallized inside the enclosure opposite a metal charge which is brought to a high temperature by the Joule effect; as a result of the thermal energy applied the charge becomes volatile and the particles condense on the parts to be metallized. The temperatures to which the charges used in the method according to the invention must be brought essentially depend upon the nature of the constituent of the charge; by way of indication a temperature of approximately 1800°–1900° C. can be indicated when the charge is formed of aluminium, a temperature of approximately 1900°–2000° C. when the charge is formed of silicon and a temperature of approximately 1100° C. when the charge is formed of silicon monoxide. In order to apply the above mentioned layer and possibly the coating which overlies it, cathodic atomization can be used. In this case, the transfer occurs in the known manner in a enclosure under reduced pressure where the parts to be metallized form the anodes and where the material to be transferred forms a cathode, an intense electrical field being established between the anodes and cathode. The field ionizes the residual gas of the enclosure and the positive ions bombard the cathode; as a result the cathodic material is deposited on the anodes.

The application of the resin layer on the metal substrate is achieved as indicated in the French Pat. No. 2 304 690; in particular electrostatic spraying of a resin powder can be carried out; the resin may be a polyurethane, polyester, acrylic or epoxy resin. The thickness of the resin layer is generally between 30 and 80 microns.

The object of the present invention is therefore a new method of manufacturing a reflecting metal surface in which a layer of powdered resin is applied to the raw metal surface, the said layer is melted and hardened in situ and a bright metal film is transferred thereto, characterized in that a fine layer containing a metal element from the group formed by nickel, nickel-chrome alloys, alloys of the preceding metal compounds with aluminium, and silicon is transferred directly to the resin layer; then, only if the above layer contains less than n% aluminium, a fine bright metal coating is transferred to this layer, the coating being a metal from the group formed by aluminium and its alloys of more than n% by weight of aluminium, n being a number at the most equal to 100, the value of which corresponds to the minimum brightness state tolerable for the reflecting metal surface to be obtained.

In a preferred embodiment the transfers of layers and possibly coatings are achieved by metallization under vacuum, i.e. by depositing at reduced pressure, by volatilization and condensation, starting from at least one charge of material to be transferred.

In a first variant a transfer is effected from a charge containing, in a form combined or not with another element such as oxygen, nickel, a nickel-chrome alloy, an alloy of the above named metal compounds with aluminium (with a content of less than n% by weight of aluminium, n having the above defined significance), or silicon, this transfer being followed by another transfer carried out from a charge formed of pure aluminium or an alloy of more than n% by weight of aluminium; advantageously it may be provided that the first transfer is carried out from a charge of silicon whereas the second is carried out from a charge of aluminium.

In another variant of an embodiment of the method according to the invention a transfer is carried out by metallization of the resin layer under vacuum from a single charge comprising, in a form combined or not with another element such as oxygen, aluminium and at least one metal compound from the group formed by the nickel and nickel-chrome alloys, the single charge containing at least n% by weight of aluminium; according to a first possibility, the charge is formed of an alloy of the present metal compounds; according to another possibility, the charge is formed of an assembly of several charges of different types.

According to a technique which is already known, the bright metal film which overlies the resin layer may be covered by a protective projection of silicon, on this occasion the silicon coming to the surface above the reflecting layer itself. In this case the projection of silicon is advantageously carried out in the same apparatus of metallization under vacuum as the preceding projections and consequently this does not considerably increase the cost/price. However, the presence of such a layer of silicon on the surface is only actually necessary if the bright film is not at all protected from the exterior, in particular in the case of reflectors inserted in ventilated or unsealed lights. On the contrary this superficial projection of silicon is completely useless if the reflector is to be used in a headlight whose optical unit is sealed as is the case when the glass of the headlight is glued directly on the front edge of the reflector.

The object of the present invention is also the novel industrial product formed by a reflector obtained by the method defined above, this reflector comprising on a metal base of substantially parabolic concave shape, a resin layer bearing a bright metal film, characterized in that the resin bears directly a layer containing at least one metal in a form which may be combined or not with another element such as oxygen, taken from the group formed by nickel, nickel-chrome alloys, alloys of the preceding metal compounds with aluminium, and silicon, the said layer, if it contains less than n% by weight of aluminium, being covered with a coating containing a metal taken from the group formed by aluminium and its alloys of more than n% by weight, the total thickness of the film on the resin being between 0.05 and 0.1 micron, n having the previously indicated significance.

In a first variant of the preferred embodiment, the resin bears a layer containing at least n% of aluminium and the coating is formed of aluminium; in particular the resin may bear a layer of silicon; the coating may be formed of an aluminium alloy and at least one material taken from the group formed by silicon, nickel and nickel-chrome alloys, aluminium being at least n% by weight; the coating may for example be formed of an aluminium and silicon alloy containing 88 to 99% by weight of aluminium.

In the case that it is necessary to protect the surface of the reflector, the bright film formed by the layer borne by the resin and possibly the coating which overlies it, is covered in a known manner by a fine projection of silicon.

Finally, the object of the present invention is the use of a reflector as defined above as an element in a lighting projector. In this use it is noted that the increase in temperature in the vicinity of the lighting lamp of the projector does not entail any tarnishing of the reflecting surface despite the absence of varnish between the resin layer and the bright metal film which it bears.

In order to make the object of the invention more comprehensible one embodiment thereof will now be described by way of a purely illustrative and non-limiting example.

The treated metal part is to form a headlight reflector for a motor vehicle. This reflector is constructed from nontreated raw metal sheet being substantially 0.7 mm thick and comprising rough surfaces which may be evaluated as being of the order of 2 microns. First a degreasing pretreatment is carried out by an alkaline wash or by a solvent, such as trichlorethylene. The degreasing operation is followed by application of polyurethane powder by an electrostatic spray gun. Powdering is followed by heating the layer of polyurethane at a temperature of 220° C. for 12 min; it is then cooled at ambient temperature for 20 min; the polyurethane layer obtained is approximately 40 to 70 microns thick.

The part thus prepared is placed in a metallization enclosure under vacuum comprising on the one hand a boat containing silicon and on the other hand a spiral tungsten filament bearing a charge of pure aluminium (99.99%). A potential difference which is sufficient to bring the silicon to approximately 2000° C. by the Joule effect is applied to the boat, and in this manner a layer of silicon dioxide is obtained on the resin layer, and then a potential difference is applied to the tungsten filament charged with aluminium in order to obtain a layer of bright aluminium on the layer of silicon dioxide, the two layers being approximately 0.05 micron thick.

It has been ascertained that a headlight reflector is thus obtained which has good optical characteristics with good resistance to corrosion as in the present technique. The optical characteristics are maintained when a lighting lamp of 60 watts is placed in the optical unit formed by the assembly (headlight reflector mirror) and the said lamp is supplied with power. It is then noted that the absence of an intermediate layer of varnish between the resin and the bright metal film no longer entails any tarnishing of the reflecting surface thanks to the particular composition adopted according to the invention.

It is evident that the embodiment described above is by no means limiting and could give rise to any desirable modifications without departing from the scope of the invention.

I claim:

1. A method of forming a heat resistant reflecting metal film on a melted and hardened resin on a substrate comprising, depositing onto said resin a thin layer containing at least one material selected from the group consisting of nickel, nickle-chrome alloys, compounds thereof, and alloys thereof with aluminum, or silicon and compounds thereof, and depositing on said layer a reflective metal film containing a high percentage of aluminum.

2. A method according to claim 1 wherein said step of depositing said reflective metal film comprises depositing a metal film containing at least 88% by weight of aluminum.

3. A method according to claim 2 wherein said step of depositing a reflective metal film comprises depositing a metal film of substantially pure aluminum.

4. A method according to claim 3 wherein said step of depositing a thin layer comprises depositing a thin layer containing silicon.

5. A method according to claim 4 wherein said step of depositing said thin layer comprises depositing a thin layer of silicon dioxide.

6. A method according to claim 1 wherein said steps of depositing said thin layer and said reflective film comprise vacuum depositing said thin layer and vacuum depositing said reflective film onto said thin layer.

7. A method according to claim 6 wherein said step of depositing said reflective film comprises depositing said film by cathodic atomization.

8. A method according to claim 1 wherein said resin comprises a polyurethane, polyester, acrylic or epoxy resin.

9. A method according to claim 1 wherein said substrate comprises a metal substrate.

10. A method according to claim 1 further comprising depositing a thin protective coating onto said reflective film.

11. A method according to claim 10 wherein said protective coating comprises a thin layer of silicon or compounds thereof.

12. A reflector having a light reflective surface applied thereto by the method of claim 1.

13. A method according to claim 1 wherein the total thickness of the thin layer and the reflective metal film is between 0.05 and 0.1 micron.

14. A method of forming a heat resistant reflecting metal film on a melted and hardened resin on a substrate comprising, depositing onto said resin, a thin reflecting metal film containing a high percentage of aluminum and at least one material selected from the group consisting of silicon, nickel, nickel-chrome alloys, and compounds thereof.

15. A method according to claim 14 wherein said step of depositing said reflecting metal film comprises depositing a metal film containing at least 88% by weight of aluminum.

16. A method according to claim 14 wherein said step of depositing said metal film comprises vacuum depositing said film in a vacuum deposition apparatus from a charge containing aluminum and at least one of said other materials.

17. A method according to claim 14 wherein said step of depositing said metal film comprises depositing said film in a vacuum deposition apparatus from a charge containing aluminum, and from another charge containing at least one of said other materials.

18. A method according to claim 14 further comprising, depositing a protective layer on said reflecting metal film.

19. A method according to claim 18 wherein said protective layer comprises a layer of silicon or compounds thereof.

* * * * *